United States Patent
Kanda

(10) Patent No.: US 9,508,761 B2
(45) Date of Patent: Nov. 29, 2016

(54) MANUFACTURING METHOD OF DISPLAY DEVICE

(71) Applicant: Japan Display Inc., Minato-ku (JP)

(72) Inventor: Noriyoshi Kanda, Tokyo (JP)

(73) Assignee: Japan Display Inc., Minato-ku (JP)

( * ) Notice: Subject to any disclaimer, the term of this patent is extended or adjusted under 35 U.S.C. 154(b) by 3 days.

(21) Appl. No.: 14/606,199

(22) Filed: Jan. 27, 2015

(65) Prior Publication Data
US 2015/0221684 A1 Aug. 6, 2015

(30) Foreign Application Priority Data
Jan. 31, 2014 (JP) ................................ 2014-017730

(51) Int. Cl.
| | | |
|---|---|---|
| *H01L 27/12* | (2006.01) | |
| *H01L 29/66* | (2006.01) | |
| *G02F 1/1362* | (2006.01) | |
| *H01L 21/768* | (2006.01) | |
| *G02F 1/1368* | (2006.01) | |
| *G02F 1/1343* | (2006.01) | |

(52) U.S. Cl.
CPC ..... *H01L 27/1288* (2013.01); *G02F 1/136227* (2013.01); *H01L 21/76804* (2013.01); *H01L 29/66757* (2013.01); *G02F 1/1368* (2013.01); *G02F 1/134363* (2013.01); *G02F 2001/13685* (2013.01); *G02F 2001/134372* (2013.01); *G02F 2201/50* (2013.01)

(58) Field of Classification Search
CPC .................................................. H01L 27/1248
See application file for complete search history.

(56) References Cited

U.S. PATENT DOCUMENTS

| | | | |
|---|---|---|---|
| 7,742,113 B2 | 6/2010 | Tanabe et al. | |
| 2003/0189210 A1* | 10/2003 | Yamazaki | G02F 1/136227 257/72 |
| 2007/0097303 A1* | 5/2007 | Sonoda | G02F 1/133345 349/122 |
| 2007/0181945 A1* | 8/2007 | Nakamura | H01L 27/1292 257/347 |

FOREIGN PATENT DOCUMENTS

JP   2007-328210   12/2007

OTHER PUBLICATIONS

U.S. Appl. No. 14/606,188, filed Jan. 27, 2015, Kanda.

* cited by examiner

*Primary Examiner* — Fernando L Toledo
*Assistant Examiner* — Valerie N Newton
(74) *Attorney, Agent, or Firm* — Oblon, McClelland, Maier & Neustadt, L.L.P.

(57) ABSTRACT

Since a film, which is the upper layer of an interlayer insulating film and has a fast etching rate, does not have dense film quality, moisture is entered from the end portion of a substrate, and it is likely that display unevenness and the like occur. A manufacturing method of a display device includes the steps of: forming a first contact hole on the first interlayer film; forming a second interlayer film on the first interlayer film and in the first contact hole, the second interlayer film having a lower layer film and an upper layer film having an etching rate faster than an etching rate of the lower layer film; forming a second contact hole on the second interlayer film; and removing at least a part of the upper layer film.

19 Claims, 20 Drawing Sheets

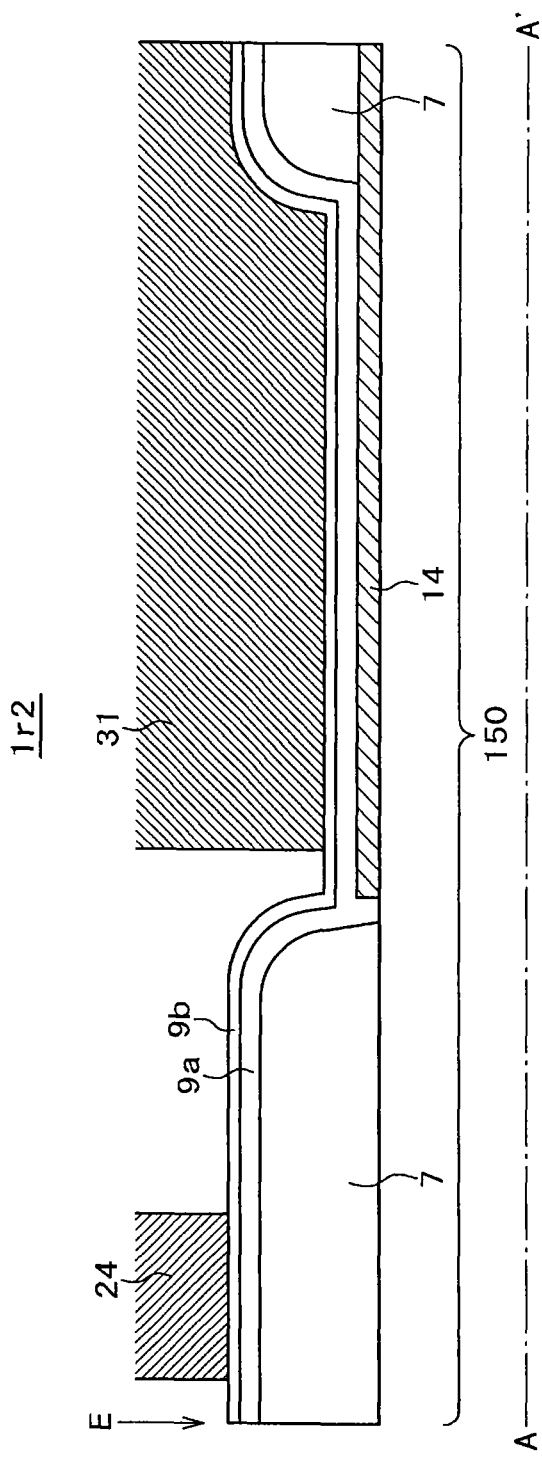

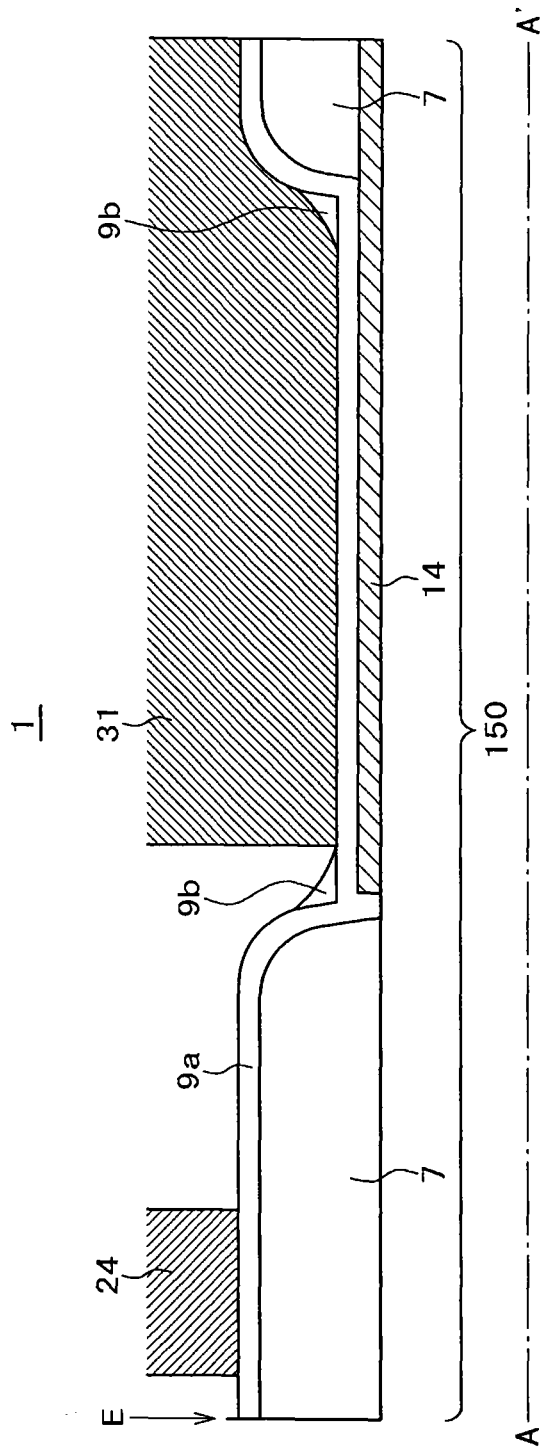

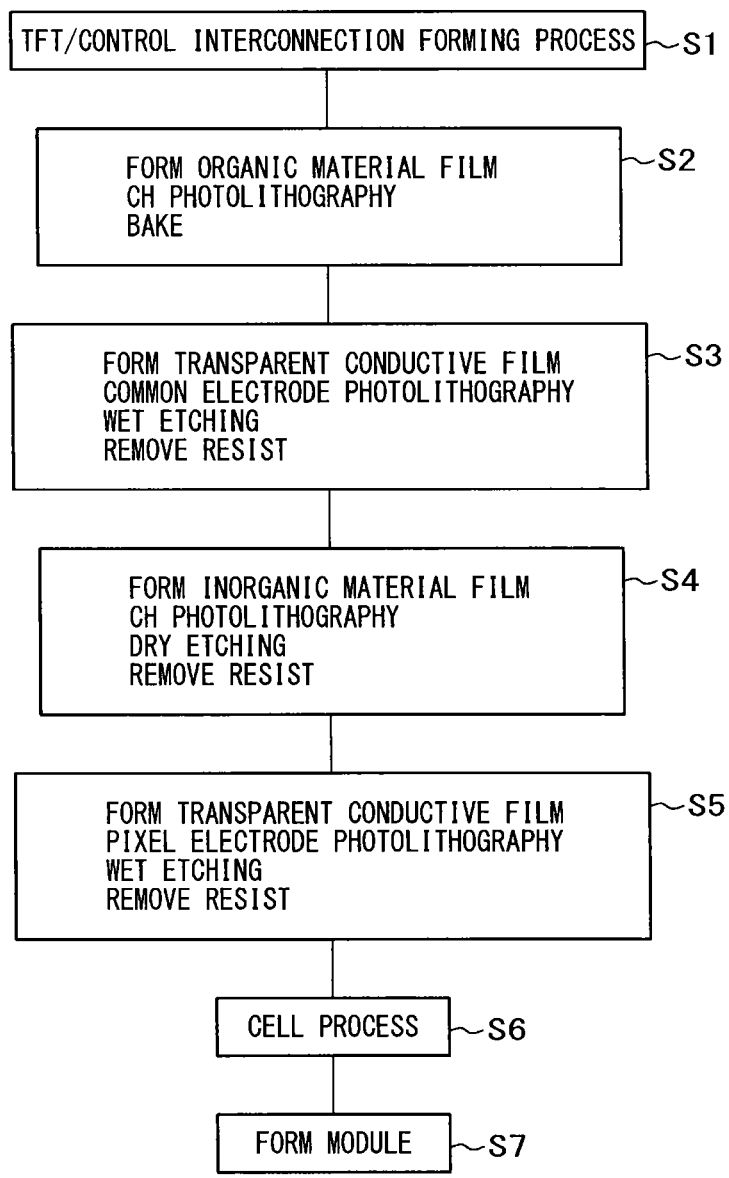

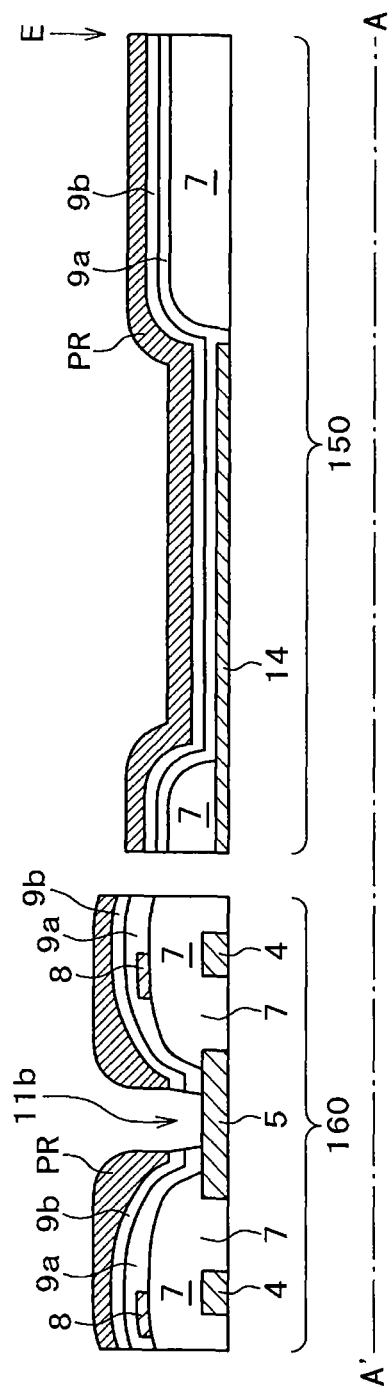

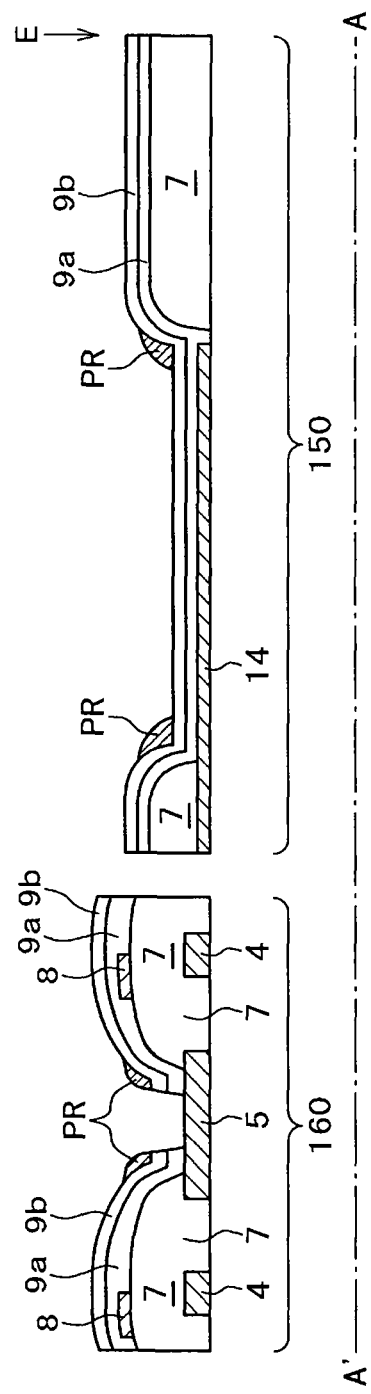

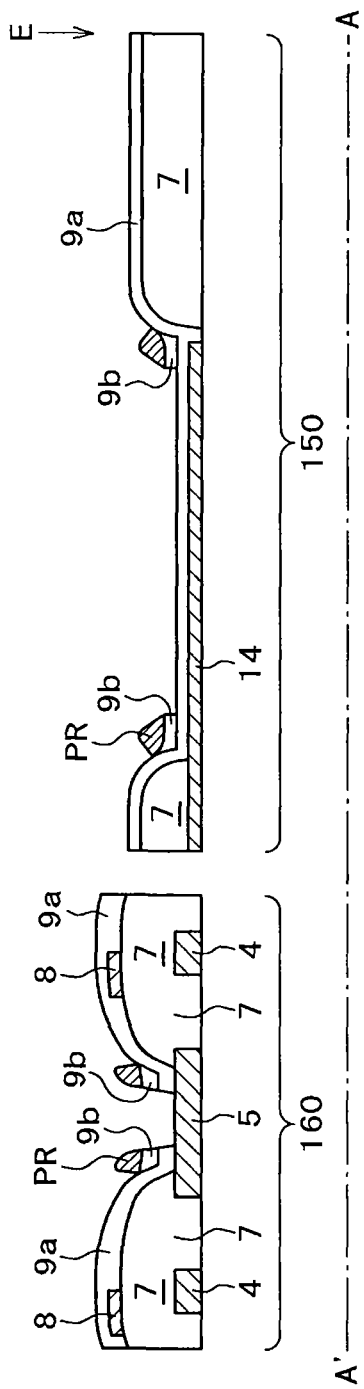

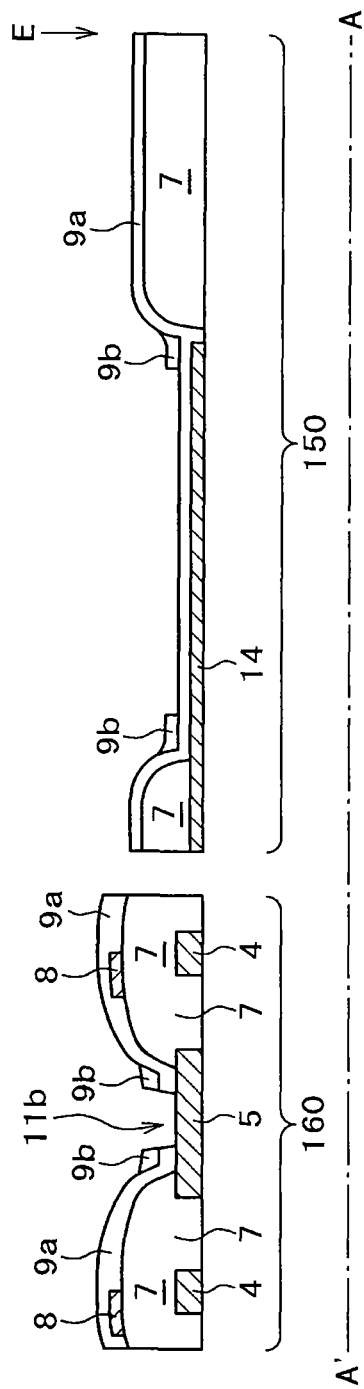

MANUFACTURING METHOD OF DISPLAY DEVICE

CLAIM OF PRIORITY

The present application claims priority from Japanese Patent Application JP2014-017730 filed on Jan. 31, 2014, the content of which is hereby incorporated by reference into this application.

BACKGROUND

The present disclosure relates to a display device, and is applicable to a display device having a contact hole that connects a pixel electrode to a source/drain electrode, for example.

An IPS (In Plane Switching) liquid crystal display device in a structure below is disclosed in Japanese Unexamined Patent Application Publication No. 2007-328210 or the specification of U.S. Pat. No. 7,742,113 corresponding to this patent literature.

On a drain electrode and a source electrode, a second interlayer insulating film is formed. On the second interlayer insulating film, an organic insulating film is formed. On the organic insulating film, a counter electrode and a reflective film are formed. On the counter electrode and the reflective film, a third interlayer insulating film is formed. On the third interlayer insulating film, a pixel electrode is formed. This pixel electrode is connected to the source electrode of a thin film transistor through a contact hole formed on the second interlayer insulating film and the third interlayer insulating film. A film having a fast etch rate (a retardation layer) is formed near the surface of the third interlayer insulating film, and a forward tapered shape is provided when the contact hole is formed.

It is noted that the electrode of the thin film transistor connected to the pixel electrode is sometimes referred to as a drain electrode, and in the following, the electrode is referred to as a drain electrode in the present specification.

SUMMARY

Since the film quality of a film having a fast etch rate is not dense like the retardation layer of the third interlayer insulating film described in Japanese Unexamined Patent Application Publication No. 2007-328210 or the specification of U.S. Pat. No. 7,742,113, it is likely that moisture is entered from the end portion of a substrate and display unevenness and the like occur.

Other problems and novel features will be apparent from the description and accompanying drawings of the present disclosure.

In the present disclosure, the following is a brief summary of representative aspects.

In other words, a manufacturing method of a display device including the steps of: (a) preparing a substrate having an electrode of a thin film transistor; (b) forming a first interlayer film on the electrode; (c) forming a first contact hole on the first interlayer film; (d) forming a second interlayer film on the first interlayer film and in the first contact hole, the second interlayer film having a first film and a second film provided above the first film, the second film having an etching rate faster than an etching rate of the first film; (e) forming a second contact hole on the second interlayer film; (f) removing at least a part of the second film; and (g) forming a transparent conductive film on the second interlayer film and in the second contact hole.

BRIEF DESCRIPTION OF THE DRAWINGS

FIG. 3C is a cross sectional view of a portion near the end portion of a substrate taken along line A-A' in FIG. 3A;

FIG. 4C is a cross sectional view of a portion near the end portion of a substrate taken along line A-A' in FIG. 4A;

FIG. 5 is a flowchart of a manufacturing method of the display device according to the embodiment;

FIG. 6B is a cross sectional view of a removal method of an upper layer film of the second interlayer film of the display device according to the embodiment;

FIG. 6C is a cross sectional view of the removal method of the upper layer film of the second interlayer film of the display device according to the embodiment;

FIG. 6D is a cross sectional view of the removal method of the upper layer film of the second interlayer film of the display device according to the embodiment;

FIG. 6E is a cross sectional view of the removal method of the upper layer film of the second interlayer film of the display device according to the embodiment;

DESCRIPTION OF THE PREFERRED EMBODIMENTS

Figure 1A:
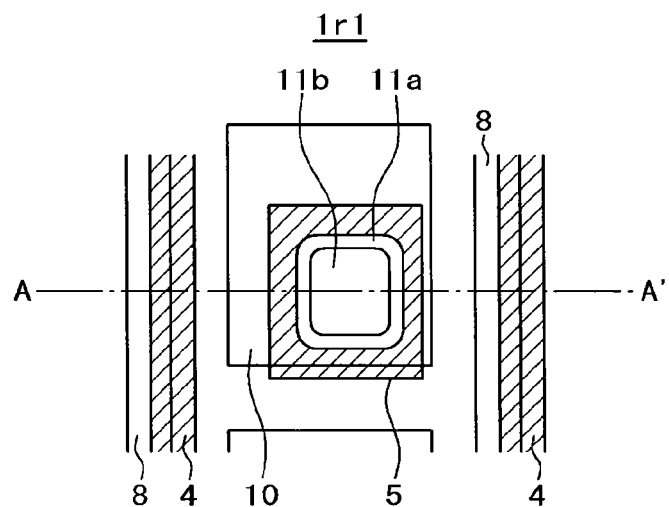
FIG. 1A is a plan view of the configuration of a display device according to a first comparative example.

In the following, an embodiment, examples, modifications, and comparative examples will be described with reference to the drawings. It is noted that the disclosure is merely an example, and appropriate modifications that can be easily conceived by a person skilled in the art within the teachings of the present invention are of course included in the scope of the present invention. Moreover, in order to make the description clearer, components are sometimes schematically illustrated on widths, thicknesses, shapes, and the like as compared with the actual forms. However, these are only examples, and will not limit the interpretation of the present invention. Furthermore, in the specification and the drawings, components similar to ones described in the drawings already mentioned are sometimes designated the same reference numerals and signs for appropriately omitting the detailed description.

First, problems of a display device according to a first comparative example will be described with reference to FIGS. 1A to 1C.

Figure 1B:
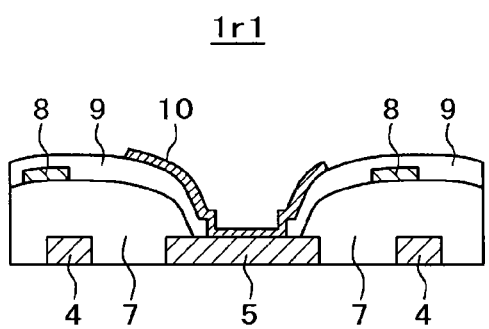
FIG. 1B is a cross sectional view taken along line A-A' in FIG. 1A.
Figure 1C:
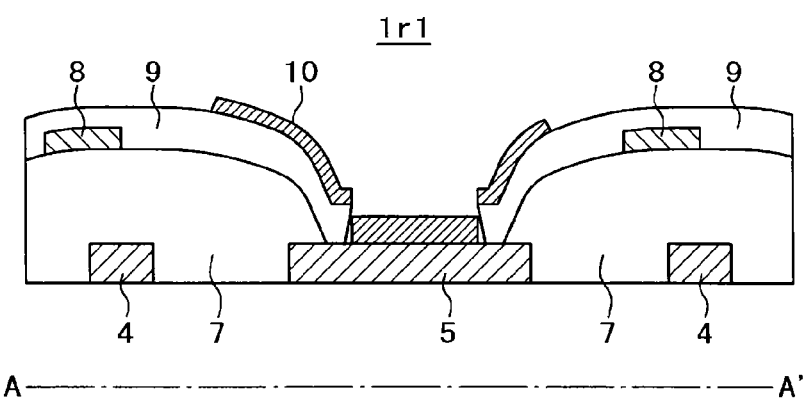
FIG. 1C is a cross sectional view of problems of the display device according to the first comparative example.

FIG. 1A is a plan view of the configuration of the display device according to the first comparative example. FIG. 1B is a cross sectional view taken along line A-A' in FIG. 1A. FIG. 1C is a cross sectional view of problems of the display device according to the first comparative example.

In a display device 1r1 according to the first comparative example, a first interlayer film 7 is formed on a source electrode 4 and a drain electrode 5 of a thin film transistor (in the following, referred to as a TFT). A hole is formed on the first interlayer film 7, and a contact hole 11a is formed on the drain electrode 5. A transparent conductive film is formed and patterned on the first interlayer film 7 to form a common electrode 8. A second interlayer film 9 is formed on the upper part of the drain electrode 5 and on the upper parts and side walls of the common electrode 8 and the first interlayer film 7, a hole is formed on the second interlayer film 9, and a contact hole 11b is formed on the drain electrode 5. A transparent conductive film is formed and patterned on the second interlayer film 9 and in the contact hole 11b (on the drain electrode 5 and on the side wall of the second interlayer film 9) to form a pixel electrode 10.

Since it is difficult to taper a resist remaining in the contact hole 11a on the first interlayer film 7 in processing the second interlayer film 9, the side wall of the second interlayer film 9 is not tapered. More specifically, when a hole is further formed on the second interlayer film 9 on the bottom of the deep, small contact hole 11a on the first interlayer film 7 whose aspect ratio exceeds 0.5 (a ratio of the hole depth to the hole diameter), the tapered angle of the side wall of the second interlayer film 9 (an angle formed between the top face of the drain electrode 5 and the side wall surface of the second interlayer film 9) is increased (the tapered angle becomes close to an angle of 90 degrees). As illustrated in FIG. 1C, the side wall of the second interlayer film 9 stands perpendicularly or is in a reverse tapered shape (the tapered angle is an angle greater than an angle of 90 degrees), and it is likely that the side wall of the second interlayer film 9 is insufficiently covered and a gap is formed on the transparent conductive film that forms the pixel electrode 10.

Next, a display device according to a second comparative example will be described with reference to FIGS. 2A to 2F.

Figure 2A:
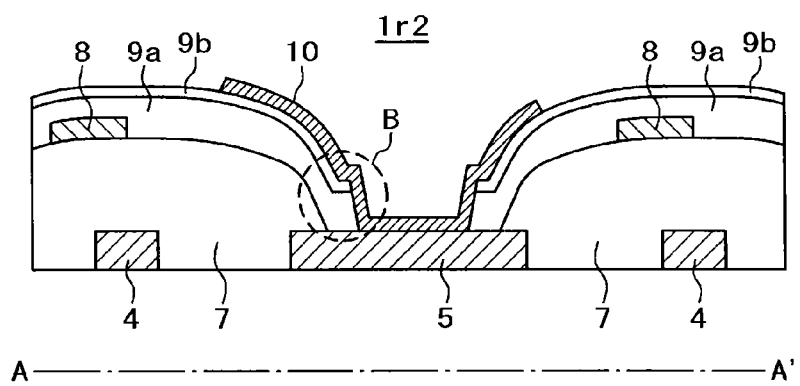
FIG. 2A is a cross sectional view of the configuration of a display device according to a second comparative example.

FIG. 2A is a cross sectional view of the configuration of the display device according to the second comparative example. FIGS. 2B to 2F are cross sectional views of a forming method of a contact hole of a second interlayer film of the display device according to the second comparative example, and are enlarged views of broken line circle B in FIG. 2A.

A display device 1r2 according to the second comparative example is different from the display device 1r1 according to the first comparative example in that the configuration of a second interlayer film 9 is different, and the others are the same. In the display device 1r2, a second interlayer film is formed to include two layers, a film the same as the second interlayer film 9 of the first comparative example is used for a lower layer film 9a of the second interlayer film, and a film having an etching rate faster than that of the lower layer film 9a is used for an upper layer film 9b of the second interlayer film. A forming method of a contact hole will be described with reference to FIGS. 2B to 2F.

Figure 2B:
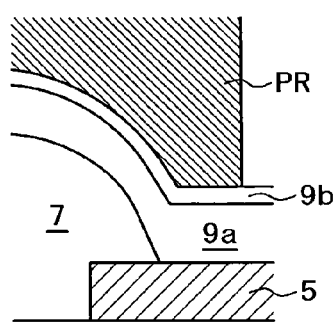
FIG. 2B is a cross sectional view of a forming method of a contact hole of a second interlayer film of the display device according to the second comparative example.
Figure 2C:
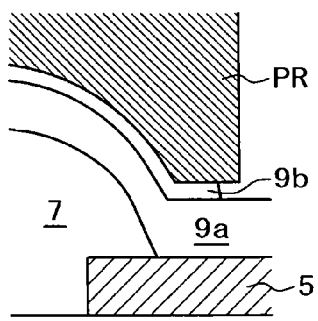
FIG. 2C is a cross sectional view of the forming method of the contact hole of the second interlayer film of the display device according to the second comparative example.
Figure 2D:
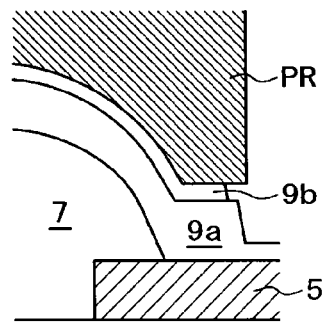
FIG. 2D is a cross sectional view of the forming method of the contact hole of the second interlayer film of the display device according to the second comparative example.
Figure 2E:
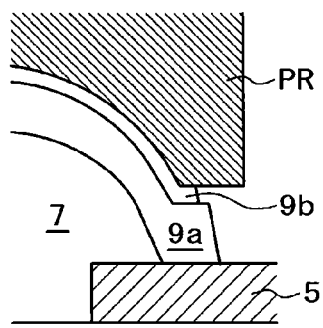
FIG. 2E is a cross sectional view of the forming method of the contact hole of the second interlayer film of the display device according to the second comparative example.
Figure 2F:
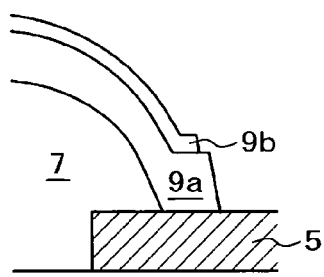
FIG. 2F is a cross sectional view of the forming method of the contact hole of the second interlayer film of the display device according to the second comparative example.

First, the lower layer film 9a and the upper layer film 9b of the second interlayer film are formed in two layers on a drain electrode 5 and on the upper part and side wall of a first interlayer film 7 under different film forming conditions. As illustrated in FIG. 2B, a photoresist PR is patterned by photolithography. Here, photolithography means that a photosensitive material such as a photoresist is exposed and developed using a mask pattern and a pattern is formed on the photosensitive material. Dry etching is performed using the photoresist PR as a mask, and then the upper layer film 9b of the second interlayer film is side etched as illustrated in FIG. 2C. After that, as illustrated in FIG. 2D, the side etching of the upper layer film 9b of the second interlayer film proceeds, and the etching of the lower layer film 9a of the second interlayer film proceeds concurrently. After that, as illustrated in FIG. 2E, the side walls of the lower layer film 9a and the upper layer film 9b of the second interlayer film are formed in a forward tapered shape (the tapered angle is an angle smaller than an angle of 90 degrees). After that, as illustrated in FIG. 2F, the resist is removed by ashing.

As illustrated in FIG. 2A, in the display device 1r2, the first interlayer film 7 is formed on a source electrode 4 and the drain electrode 5, a common electrode 8 and the lower layer film 9a and the upper layer film 9b of the second interlayer film are formed on the first interlayer film 7. A pixel electrode 10 is formed on the upper layer film 9b of the second interlayer film, on the side walls of the lower layer film 9a and the upper layer film 9b, and on the drain electrode 5 in the contact hole. The side walls of the lower layer film 9a and the upper layer film 9b of the second interlayer film are in a forward tapered shape, so that a transparent conductive film forming the pixel electrode 10 can sufficiently cover the side walls of the lower layer film 9a and the upper layer film 9b of the second interlayer film, and the formation of a gap can be decreased.

Next, problems of the display device according to the second comparative example will be described with reference to FIGS. 3A to 3C.

Figure 3A:
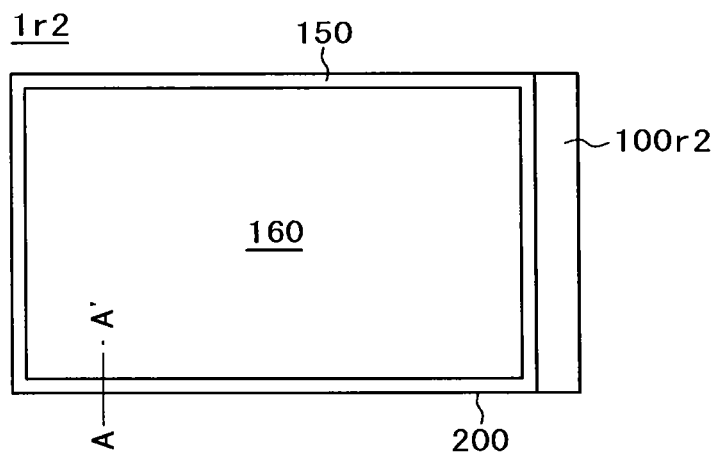
FIG. 3A is a plan view of the configuration of the display device according to the second comparative example.
Figure 3B:
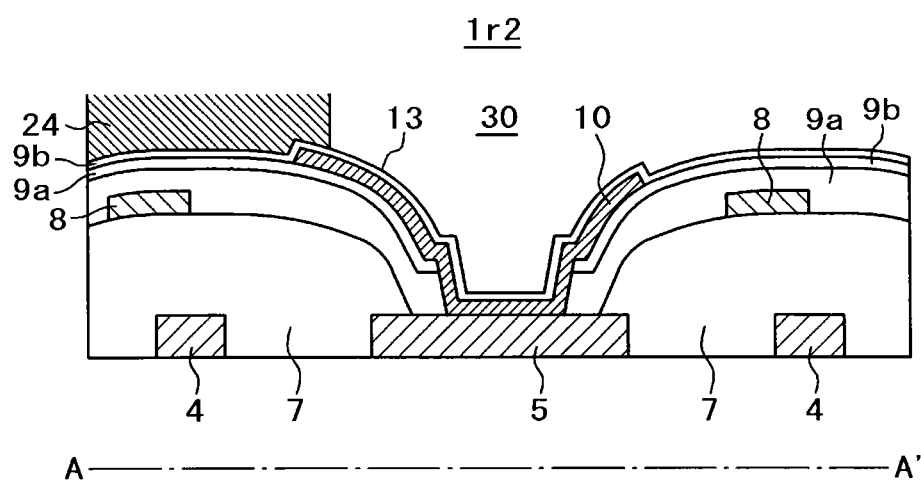
FIG. 3B is a cross sectional view of an active region taken along line A-A' in FIG. 3A.

FIG. 3A is a plan view of the configuration of the display device according to the second comparative example. FIG. 3B is a cross sectional view of an active region taken along line A-A' in FIG. 3A. FIG. 3C is a cross sectional view of a portion near the end portion of a panel taken along line A-A' in FIG. 3A.

As illustrated in FIG. 3A, the display device 1r2 includes an array substrate 100r2 and a counter substrate 200, and has an active region 160 and a picture frame region 150. As illustrated in FIG. 3B, on the active region 160, an alignment film 13 is formed on the pixel electrode 10 and the second interlayer film 9b of the array substrate 100r2, and a photo spacer 24 is contacted on the alignment film 13, in which the photo spacer 24 is formed on a liquid crystal layer 30 and the counter substrate 200. It is noted that the structure below the alignment film 13 is the same as the structure in FIG. 2A. As illustrated in FIG. 3C, on the picture frame region 150, the photo spacer 24 is contacted on the upper layer film 9b of the second interlayer film, in which the photo spacer 24 is formed on the counter substrate 200, and a sealing material 31 is attached to the photo spacer 24. The second interlayer films 9a and 9b extend to a substrate end E of the array substrate 100r2.

Since the upper layer film 9b of the second interlayer film is a film having a fast etching rate and the film quality is not dense, it is likely that moisture is entered from the substrate end E of the array substrate 100r2 and display unevenness and the like occur.

Next, the structure of a display device according to an embodiment will be described with reference to FIGS. 4A to 4C.

Figure 4A:
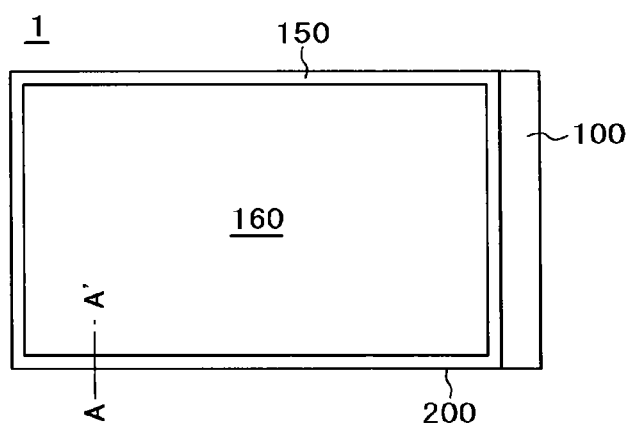
FIG. 4A is a plan view of the configuration of a display device according to an embodiment.
Figure 4B:
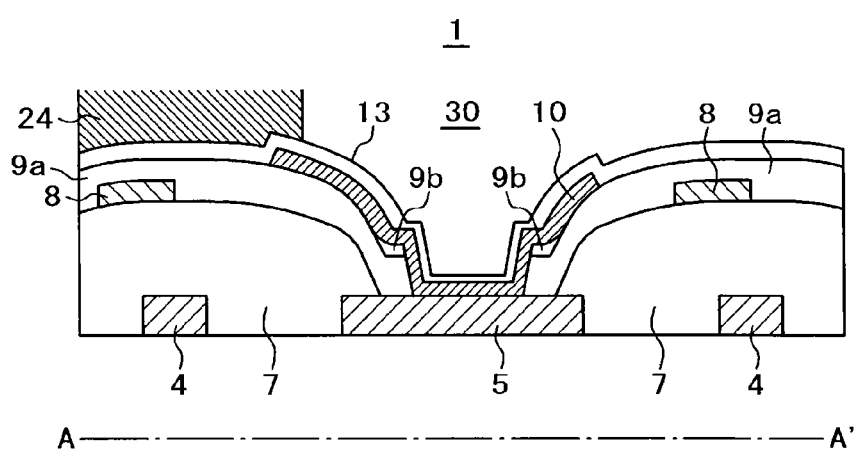
FIG. 4B is a cross sectional view of an active region taken along line A-A' in FIG. 4A.

FIG. 4A is a plan view of the configuration of the display device according to the embodiment. FIG. 4B is a cross sectional view of an active region taken along line A-A' in FIG. 4A. FIG. 4C is a cross sectional view of a portion near the end portion of a panel taken along line A-A' in FIG. 4A.

As illustrated in FIG. 4A, a display device 1 according to the embodiment includes an array substrate 100 and a counter substrate 200, and has an active region 160 and a picture frame region 150. As illustrated in FIG. 4B, on the active region 160 of the display device 1 according to the embodiment, a first interlayer film 7 is formed on a source electrode 4 and a drain electrode 5 of the array substrate 100, and a common electrode 8 and a lower layer film (a first film) 9a and an upper layer film (a second film) 9b of a second interlayer film are formed on the first interlayer film 7. A pixel electrode 10 is formed on the upper layer film 9b of the second interlayer film, on the side walls of the lower layer film 9a and the upper layer film 9b, and on the drain electrode 5 in a contact hole. An alignment film 13 is formed on the pixel electrode 10 and the lower layer film 9a of the second interlayer film, and a photo spacer 24 is contacted on the alignment film 13, in which the photo spacer 24 is formed on a liquid crystal layer 30 and the counter substrate 200. The display device 1 is different from the display device 1r2 according to the second comparative example in that the upper layer film 9b of the second interlayer film is removed except a part of the upper layer film 9b (near the contact hole).

Moreover, as illustrated in FIG. 4C, on the picture frame region 150, the lower layer film 9a of the second interlayer film is formed on an interconnection layer 14 in the same layer as the first interlayer film 7, the source electrode 4, and the drain electrode 5. The photo spacer 24 is contacted on the lower layer film 9a of the second interlayer film, in which the photo spacer 24 is formed on the counter substrate 200, and a sealing material 31 is attached to the photo spacer 24. The display device 1 is different from the display device 1r2 according to the second comparative example is in that the upper layer film 9b of the second interlayer film is removed except a part of the upper layer film 9b (near a recess). In other words, the upper layer film 9b of the second interlayer film does not extend to a substrate end E of the array substrate 100. The upper layer film 9b of the second interlayer film whose film quality is not dense is removed, so that moisture can be prevented from being entered from the substrate end E of the array substrate 100. At least a part of the upper layer film 9b of the second interlayer film, which is to be a route to enter moisture, is removed near the substrate end E or on the picture frame region 150, so that moisture can be prevented from reaching the active region, and the occurrence of display unevenness and the like can be suppressed. It is noted that the lower layer film 9a of the second interlayer film is disposed between the first interlayer film 7 and the interconnection layer 14, so that moisture can be prevented from being entered from the substrate end E in the case where an organic film is used for the first interlayer film 7. The second interlayer film is formed in a two-layer structure including the upper layer film and the lower layer film. However, the second interlayer film is not limited to the two-layer structure, and may have a structure including three layers or more. In this case, it may be fine that the second interlayer film is a film having a fast etching rate in which the etching rate becomes faster in more upper layers.

A manufacturing method of the display device according to the embodiment includes steps below.

(a) The step of preparing a substrate having an electrode of a thin film transistor.
(b) The step of forming an interlayer film on the electrode.
(c) The step of forming a first contact hole on the first interlayer film.
(d) The step of forming a second interlayer film on the first interlayer film and the first contact hole, the second interlayer film including a first film and a second film on the first film, the second film having an etching rate faster than the etching rate of the first film.
(e) The step of forming a second contact hole on the second interlayer film in the first contact hole.
(f) The step of removing at least a part of the second film.
(g) The step of forming a transparent conductive film on the second interlayer film and the second contact hole.

The manufacturing method of the display device according to the embodiment will be described more specifically with reference to FIG. 5.

FIG. 5 is a flowchart of the manufacturing method of the display device according to the embodiment.

First, on a transparent substrate such as glass, TFTs, control interconnections that control the TFTs (a gate electrode interconnection, a source electrode interconnection, and a drain electrode interconnection), and the like are formed (Step S1, the step (a)).

An organic material such as a photosensitive resin is formed throughout on the surface, photolithography and baking are performed, and the first interlayer film 7 and a contact hole (CH, a first contact hole) 11a of the first interlayer film 7 are formed (Step S2, the steps (b) and (c)).

An inorganic material is formed throughout on the surface, photolithography, dry etching, and removal of a resist are performed, and the lower layer film 9a and the upper layer film 9b of the second interlayer film and a contact hole (CH, a second contact hole) 11b of the second interlayer film are formed (Step S4, the steps (d) and (e)).

A transparent conductive film is formed throughout on the surface, photolithography, wet etching, and removal of a resist are performed, and the pixel electrode 10 is formed (Step S5, the step (g)).

It is noted that preferably, after Step S2, a transparent conductive film is formed throughout on the surface, photolithography, wet etching, and removal of a resist are performed, and the common electrode 8 is formed (Step S3).

In a cell process, the alignment film 13 is formed on the pixel electrode 10, rubbing or UV ray application is performed for alignment, the array substrate 100 is bonded to the counter substrate 200 using the sealing material 31 to seal liquid crystals, and a polarizer is mounted (Step S6). In forming a module, a driver IC, flat cables, a backlight, and the like are mounted (Step S7).

Next, the detail of Step S4 (a removal method of the upper layer film of the second interlayer film) will be described with reference to FIGS. 6A to 6E.

Figure 6A:
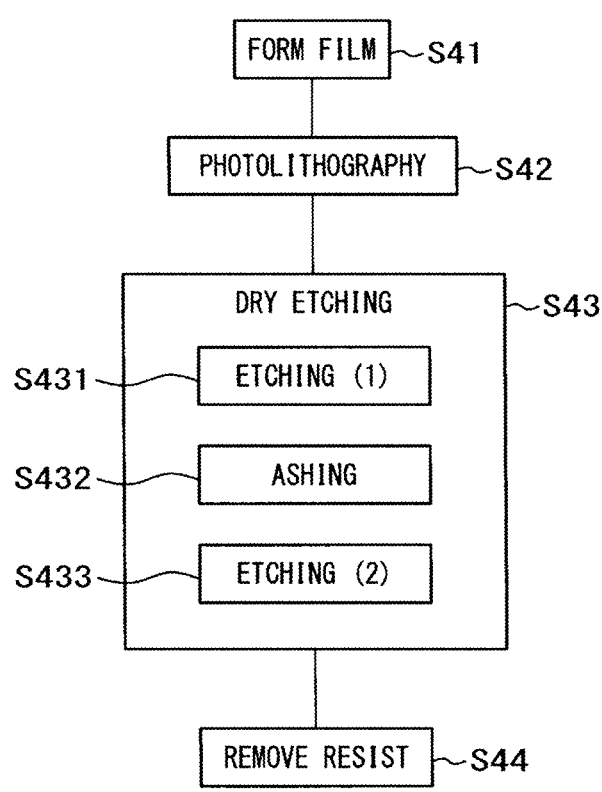
FIG. 6A is a flowchart of a forming method of a contact hole of a second interlayer film of the display device according to the embodiment.

FIG. 6A is a flowchart of a forming method of the contact hole of the second interlayer film of the display device according to the embodiment. FIGS. 6B to 6E are cross sectional views of a removal method of the upper layer film of the second interlayer film of the display device according to the embodiment.

As illustrated in FIG. 6A, the forming method of the contact hole of the second interlayer film includes the step of forming a film (Step S41), the step of photolithography (Step S42), the step of dry etching (Step S43), and the step of removing a resist (Step S44). Step S43 includes the step of etching (1) (Step S431), the step of ashing (Step S432), and the step of etching (2) (Step S433).

In Step 41, an inorganic material is formed into a film as the film forming conditions are changed, and the second interlayer film having the lower layer film 9a and the upper layer film 9b whose etching rate is faster than that of the lower layer film 9a is formed.

In Step S42, similarly in FIG. 2B, a photoresist is patterned by photolithography.

In the step of etching (1) in Step S431, similarly in FIGS. 2C to 2E, the side walls of the lower layer film 9a and the upper layer film 9b of the second interlayer film are formed in a forward tapered shape by dry etching. FIG. 6B is the cross sectional structure at a point in time when Step S431 is finished. The left side in FIG. 6B is a cross sectional view of the active region 160, and the right side is a cross sectional view of the picture frame region 150. Moreover, the left side and the right side in FIG. 6B are opposite to those in FIGS. 4B and 4C. In the following, the same thing is applied to FIGS. 6C to 6E.

In the step of ashing in Step S432, as illustrated in FIG. 6C, the photoresist on a relatively flat portion is removed by ashing. However, since the photoresist is thick on the step portion near the contact hole 11b, for example, the photoresist PR remains, and the resist remains.

In the step of etching (2) in Step S433, as illustrated in FIG. 6D, dry etching is additionally performed, and the upper layer film 9b of the second interlayer film is removed. However, the upper layer film 9b of the second interlayer film is partially left as the remaining photoresist PR is a mask.

In the step of removing the resist in Step S44, as illustrated in FIG. 6E, the remaining photoresist PR is removed in a wet manner.

Next, other forming methods of the contact hole of the second interlayer film will be described with reference to FIGS. 7A to 7C.

Figure 7A:
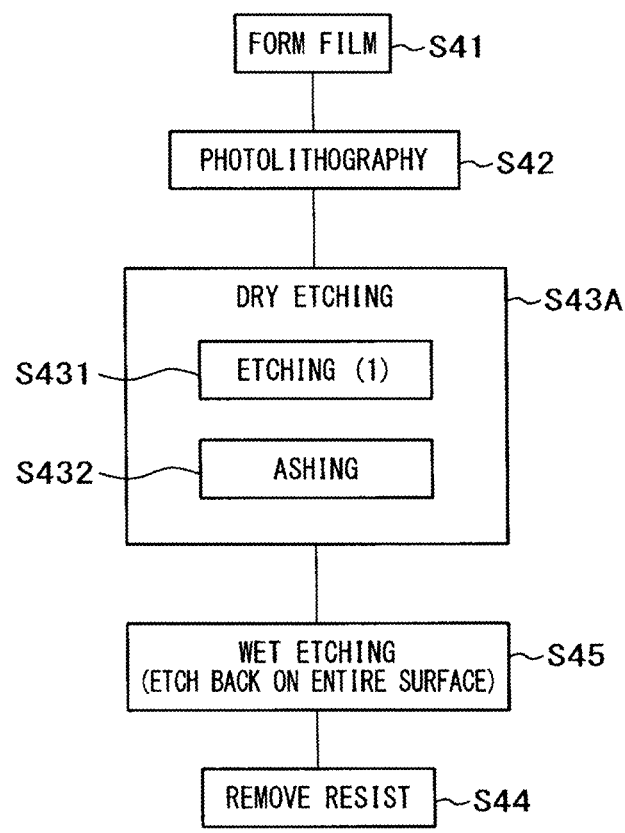
FIG. 7A is a flowchart of a forming method of a contact hole of a second interlayer film of a display device according to a first modification.

FIG. 7A is a flowchart of a forming method of a contact hole of a second interlayer film of a display device according to a first modification. FIG. 7B is a flowchart of a forming method of a contact hole of a second interlayer film of a display device according to a second modification. FIG. 7C is a flowchart of a forming method of a contact hole of a second interlayer film of a display device according to a third modification.

The forming method of the contact hole of the second interlayer film according to the first modification includes the step of forming a film (Step S41), the step of photolithography (Step S42), the step of dry etching (Step S43A), the step of wet etching (Step S45), and the step of removing a resist (Step S44) as illustrated in FIG. 7A. Step S43A includes the step of etching (1) (Step S431) and the step of ashing (Step S432).

In the forming method of the contact hole of the second interlayer film according to the first modification, Step S45 is performed instead of Step S433 according to the embodiment. In the step of wet etching in Step S45, etching is performed using phosphoric acid or hydrogen fluoride (the surface is etched back entirely), and the upper layer film 9b of the second interlayer film is removed. However, similarly to the embodiment, the upper layer film 9b of the second interlayer film is partially left as the remaining photoresist PR is a mask. In the first modification, the step of wet etching is added.

Figure 7B:
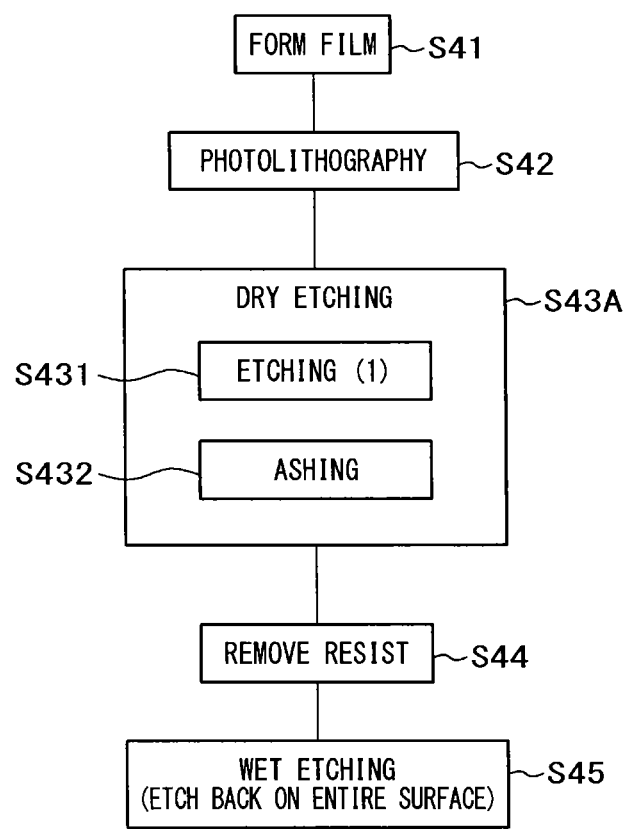
FIG. 7B is a flowchart of a forming method of a contact hole of a second interlayer film of a display device according to a second modification.

The forming method of the contact hole of the second interlayer film according to the second modification includes the step of forming a film (Step S41), the step of photolithography (Step S42), the step of dry etching (Step S43A), the step of removing a resist (Step S44), and the step of wet etching (Step S45) as illustrated in FIG. 7B.

The forming method of the contact hole of the second interlayer film according to the second modification is a method in which Step S45 is replaced by the step of removing a resist in Step 44 in the first modification. In the step of wet etching in Step S45, etching is performed using phosphoric acid or hydrogen fluoride (the surface is etched back entirely), and the upper layer film 9b of the second interlayer film is removed. Also in the second modification, the step of wet etching is added. It is noted that since the step of removing a resist (Step S44) is performed prior to the step of wet etching (Step S45), all of the upper layer film 9b of the second interlayer film is removed, as different from the embodiment and the first modification.

Figure 7C:
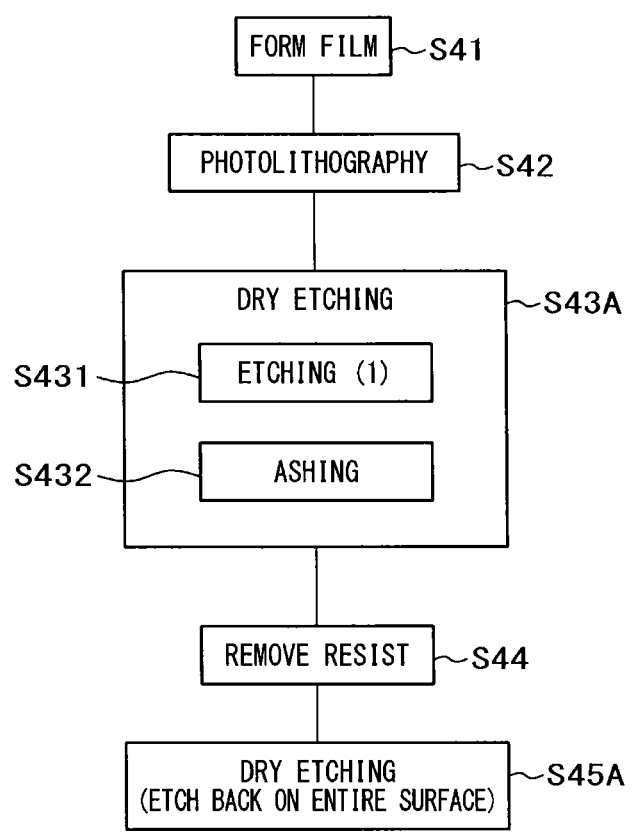
FIG. 7C is a flowchart of a forming method of a contact hole of a second interlayer film of a display device according to a third modification.

The forming method of the contact hole of the second interlayer film according to the third modification includes the step of forming a film (Step S41), the step of photolithography (Step S42), the step of dry etching (Step S43A), the step of removing a resist (Step S44), and the step of dry etching (Step S45A) as illustrated in FIG. 7C.

In the forming method of the contact hole of the second interlayer insulating film according to the third modification, Step 45A is performed instead of Step S45 in the second modification. In the step of dry etching in Step S45A, dry etching is performed (the surface is etched back entirely), and the upper layer film 9b of the second interlayer film is removed. Also in the third modification, the step of dry etching is added. It is noted that since the step of removing a resist (Step S44) is performed prior to the step of dry etching (Step S45A), all of the upper layer film 9b of the second interlayer film is removed similarly to the second modification.

The contact hole that conducts electricity between the pixel electrode 10 and the drain electrode 5 according to the embodiment is in a configuration in which a hole is further formed in the hole of the first interlayer film 7 and on the lower layer film 9a and the upper layer film 9b of the second interlayer film on the bottom of the hole. This configuration is effective to such a hole that the hole of the first interlayer film 7 has a high aspect ratio (=the hole depth/the hole diameter >0.5). Moreover, such films are preferable that both of the lower layer film 9a and the upper layer film 9b of the second interlayer film can be dry etched simultaneously using the same gas under the same conditions. In the case where dry etching is performed simultaneously using the same gas under the same conditions, it is preferable that the etching rate of the upper layer film 9b be greater than the etching rate of the lower layer film 9a. For the lower layer film 9a and the upper layer film 9b of the second interlayer film, SiN films (silicon nitride films) under different film forming conditions are preferable. It is preferable to satisfy relational expression (1) below where the film thickness of the lower layer 9a is defined as x, the film thickness of the upper layer 9b is defined as y, the etching rate of the lower layer film 9a is defined as a, and the etching rate of the upper layer film 9b is defined as b:

$$0 < y \leq 0.2 \cdot (b/a) \cdot x, a < b \ldots \quad (1).$$

When relational expression (1) above is satisfied, an amount of the lower layer film 9a to be etched can be suppressed to an amount within 3% of the total thickness of the lower layer film 9a in etching for removing the upper layer film 9b after ashing.

In examples below, an IPS display device will be described. However, the disclosure is not limited to the IPS display device, and is applicable to a lateral field display device such as an FFS display device.

FIRST EXAMPLE

First, the structure of a display device according to a first example will be described with reference to FIGS. 8 to 11.

Figure 8:
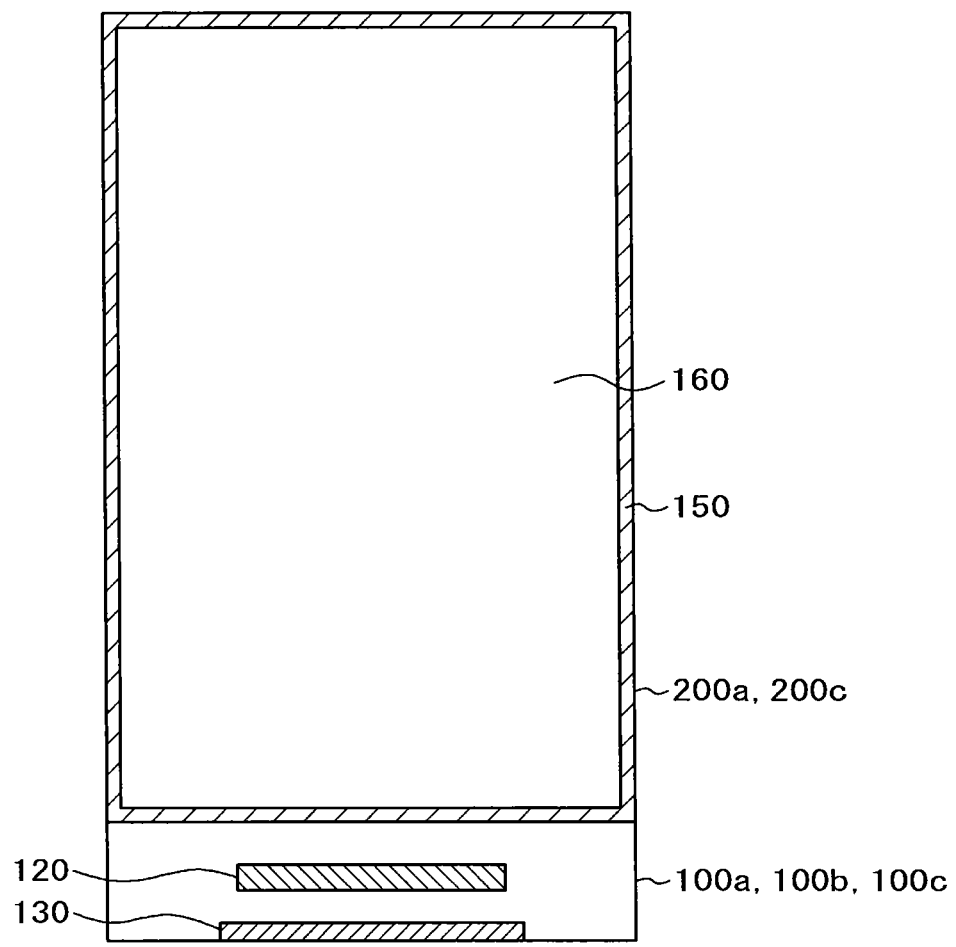
FIG. 8 is a plan view of a display device according to a first example, a second example, and a third example.
Figure 9:
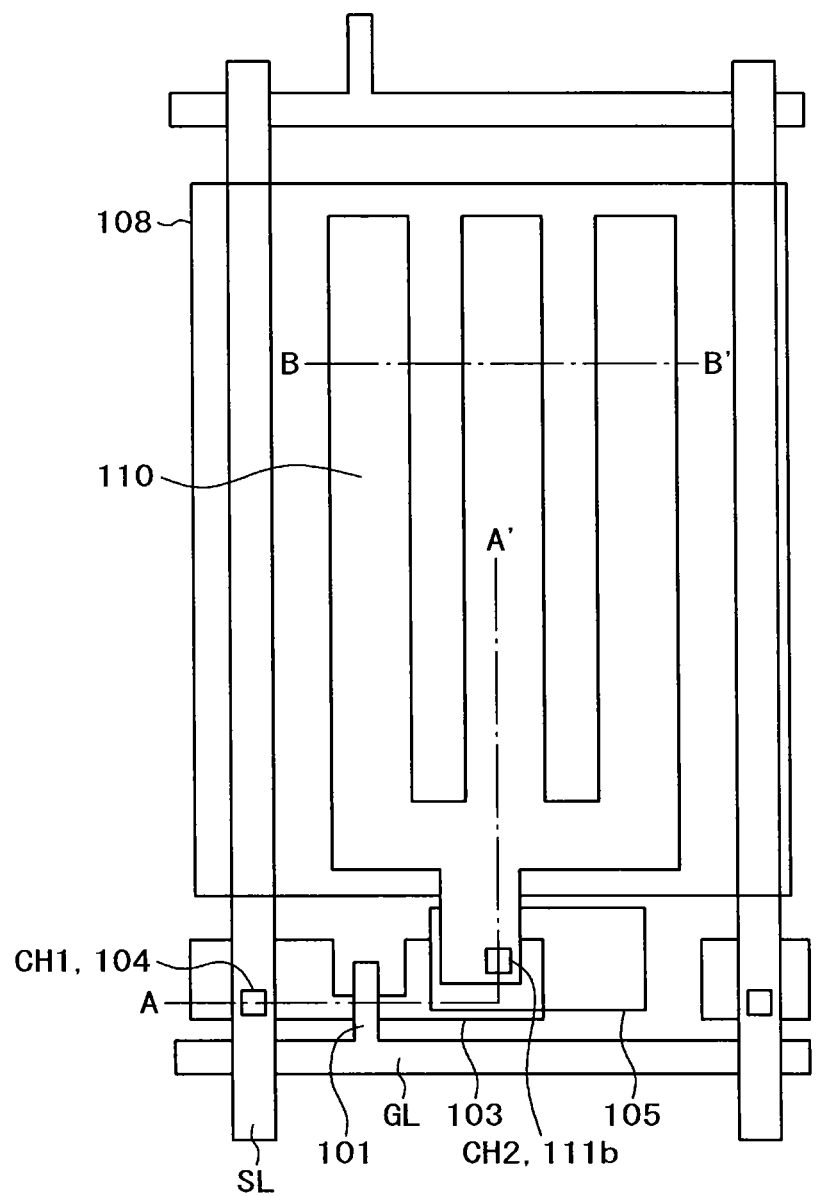
FIG. 9 is a plan view of the structure of a pixel portion on a display region of the display device according to the first example and the second example.
Figure 10:
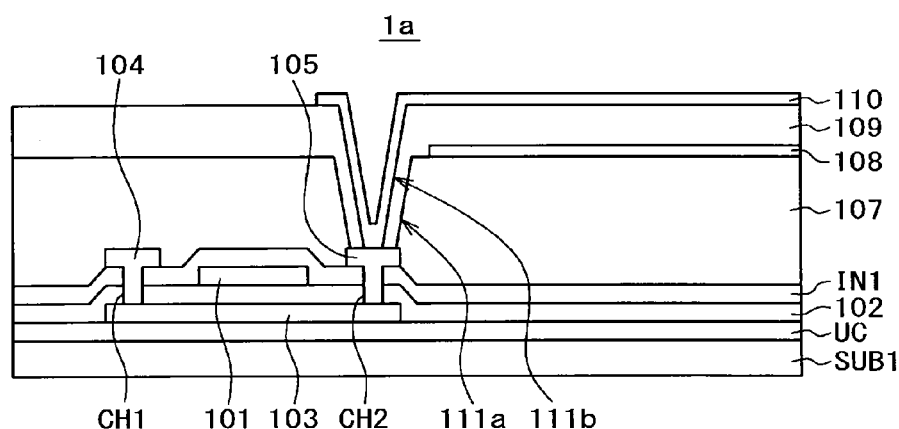
FIG. 10 is a cross sectional view taken along line A-A' in FIG. 9.
Figure 11:
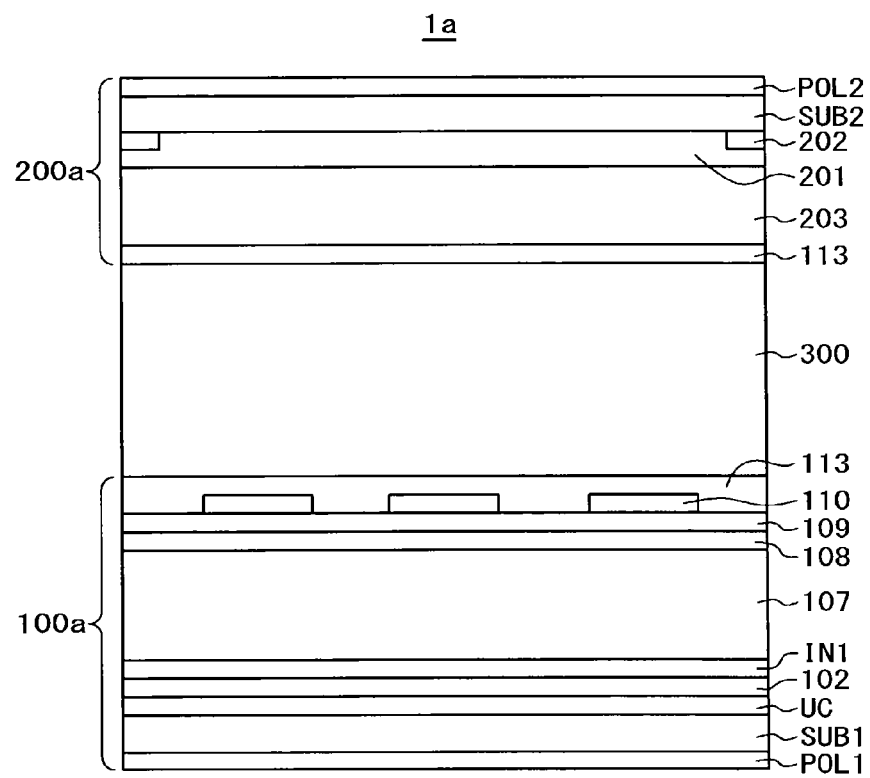
FIG. 11 is a cross sectional view taken along line B-B' in FIG. 9.

FIG. 8 is a plan view of a display device according to the first example, a second example, and a third example. FIG. 9 is a plan view of the structure of a pixel portion on a display region of the display device according to the first example and the second example. FIG. 10 is a cross sectional view taken along line A-A' in FIG. 9. FIG. 11 is a cross sectional view taken along line B-B' in FIG. 9.

As illustrated in FIG. 8, a display device 1a according to the first example includes an array substrate 100a, a counter substrate 200a, and a liquid crystal layer 300 sandwiched between the array substrate 100a and the counter substrate 200a. The counter substrate 200a is attached to the array substrate 100a through a sealing material.

The array substrate 100a is formed greater than the counter substrate 200a. A portion where only the array substrate 100a is provided is a terminal region in which an IC terminal 120 that connects a driver IC and the like, a flexible circuit board terminal 130 that connects an external circuit, and the like are formed.

The display device 1a is an active matrix liquid crystal display device, in which a plurality of pixels is disposed in a matrix configuration. The array substrate 100a includes a plurality of scanning signal lines GL and a plurality of image signal lines SL intersecting with the plurality of the scanning signal lines GL. A TFT is provided near intersection points for the switching device of the pixel. The array substrate is also referred to as a TFT substrate. The counter substrate 200a includes a color filter (CF) 201 and the like. The counter substrate is also referred to as a CF substrate. It is noted that in FIG. 9, one sub pixel is illustrated in a plurality of sub pixels disposed in a matrix configuration.

As illustrated in FIGS. 10 and 11, on a transparent insulating substrate SUB1 such as glass, an under coat film UC, a semiconductor film 103 such as polysilicon, a gate insulating film 102, a gate electrode 101 of the TFT, and an interlayer insulating film IN1 are formed from lower layers. On the interlayer insulating film IN1, a source electrode 104 and a drain electrode 105 of the TFT are formed.

The gate electrode 101 is integrally formed with the scanning signal line GL. A part of the image signal line SL also serves as the source electrode 104 in the structure in which the image signal line SL is connected to the source electrode 104. The source electrode 104 is connected to the source region (the semiconductor film 103) of the TFT through a contact hole CH1 formed on the gate insulating film 102 and the interlayer insulating film IN1. The drain electrode 105 is connected to the drain region (the semiconductor film 103) of the TFT through a contact hole CH2 formed on the gate insulating film 102 and the interlayer insulating film IN1.

On the source electrode 104 and the drain electrode 105, an organic insulating film (a first interlayer film) 107 is formed. On the organic insulating film 107, a contact hole (a first contact hole) 111a is formed. On the organic insulating film 107, a common electrode (a counter electrode) 108 is formed. On the side wall of the organic insulating film 107 and on the common electrode 108 in the contact hole 111a, an interlayer insulating film (a second interlayer film) 109 is formed. On the interlayer insulating film 109, a pixel electrode 110 is formed. The pixel electrode 110 is connected to the drain electrode 105 of the TFT through a contact hole (a second contact hole) 111b formed on the interlayer insulating film 109.

On the pixel electrode 110, an alignment film 113 is formed. Moreover, on the substrate SUB1 on the opposite side of the liquid crystal layer 300, a polarizer POL1 is disposed. It is noted that the alignment film 113 and the polarizer POL1 are omitted in FIG. 10.

As illustrated in FIG. 11, on a transparent insulating substrate SUB2 such as glass, a black matrix 202, a color filter 201, an overcoat film 203, and an alignment film 113 are formed. Moreover, on the substrate SUB2 on the opposite side of the liquid crystal layer 300, a polarizer POL2 is disposed.

As illustrated in FIG. 9, the pixel electrode 110 has linear portions, and formed in a comb teeth shape. The common electrode 108 is formed in a plane shape. An electric field generated across the pixel electrode 110 and the common electrode 108 drives the liquid crystals 300 for display. The pixel electrode 110 and the counter electrode 108 are formed of a transparent conductive film such as ITO (Indium Tin Oxide).

A common potential different from a potential applied to the pixel electrode 110 is supplied to the common electrode 108. Therefore, the common electrode 108, the pixel electrode 110, and the interlayer insulating film 109 form a retention capacitance. In other words, the common electrode 108 also serves as a capacitive electrode. Here, when a silicon nitride film is used for the interlayer insulating film 109, a dielectric constant is high as compared with the case where a silicon oxide film is used. Thus, the retention capacitance can be increased. Moreover, when the pixel electrode 110 and the common electrode 108 are formed of a transparent conductive film, a transparent retention capacitance can be formed, so that the aperture ratio can be increased.

For the organic insulating film 107, for example, a photosensitive acrylic resin and the like are preferably used. The organic insulating film 107 is used, so that flatness can be increased as compared with the case where an inorganic insulating film is used. Moreover, a thick film is easily formed, so that a parasitic capacitance can be decreased. The organic insulating film is also referred to as an organic planarization film.

The interlayer insulating film 109 is formed above the organic insulating film 107. Since the organic insulating film 107 generally has heat-resisting properties that are not so excellent, the interlayer insulating film 109 is formed by plasma CVD. In order to increase a dielectric constant, a silicon nitride film is adopted for the interlayer insulating film 109.

An aluminum silicon alloy and a molybdenum tungsten alloy, for example, are used for the source electrode 104 and the drain electrode 105.

In the following, an exemplary manufacturing method according to the example will be described.

After the TFT is formed by a general method, a photosensitive acrylic resin, for example, is applied as the organic insulating film 107 on the source electrode 104 and the drain electrode 105, and exposed and patterned. The thickness is 2.2 μm.

Subsequently, on the organic insulating film 107, a film of the common electrode 108 is formed in a thickness of 77 nm with ITO and patterned. Here, the source electrode 105 has a three-layer structure in which the upper layer is a molybdenum tungsten alloy (MoW) in a thickness of 75 nm, the middle layer is an aluminum silicon alloy (AlSi) including 1% of Si in a thickness of 500 nm, and the lower layer is a molybdenum tungsten alloy (MoW) in a thickness of 40 nm.

Subsequently, on the common electrode 108, a silicon nitride film is formed as the interlayer insulating film 109 by plasma CVD. In consideration of the influence of the organic insulating film 107, which is disposed below the interlayer insulating film 109, the film forming conditions at this time are in which the film is formed at low temperatures that are the heatproof temperature of the organic insulating film 107 or less, the film forming temperature (the substrate temperature) ranges from temperatures of 180 to 250° C. (desirably a temperature of 220° C.), and the film thickness ranges from 100 to 500 nm (desirably a thickness of 300 nm).

Moreover, desirably at this time, a gas flow ratio between monosilane ($SiH_4$) and ammonia ($NH_3$), which are material gases in forming the film by plasma CVD, is set to a ratio of 1:6 in the case where a general bulk layer is formed for the interlayer insulating film 109, and the gas flow rate of ammonia ($NH_3$) is increased in the midway point to a ratio of 1:16, for example, and a portion near the surface of the interlayer insulating film 109 is formed in a film having an etching rate faster than in the other portions (the bulk layer, the lower layer film, and the first film). The film thickness of the portion near the surface of the interlayer insulating film 109 having an etching rate faster than in the other portions desirably is in a range of 5% or more and 30% or less of the film thickness of the interlayer insulating film 109 (desirably in a range of about 8% to 12%). As described above, a film having a fast etching rate (the retardation layer, the upper layer film, and the second film) is formed near the surface, so that a forward tapered shape can be provided when the contact hole 111b is formed.

Subsequently, a photoresist is formed on the interlayer insulating film 109. The photoresist is used as a mask to etch the interlayer insulating film 109, and the contact hole 111b is formed. For an etching gas, a mixed gas of sulfur hexafluoride ($SF_6$) and oxygen ($O_2$) is used for dry etching. After that, the photoresist is removed by ashing. It may be fine that at this time, the photoresist is partially left. Dry etching is additionally performed, and the upper layer film of the interlayer insulating film 109 is removed. The remaining photoresist is removed in a wet manner. It may be fine that the upper layer film of the interlayer insulating film 109 is removed by any one of the methods according to the first modification to the third modification.

Subsequently, the pixel electrode 110 is formed on the interlayer insulating film 109 with ITO. The film thickness is 77 nm.

SECOND EXAMPLE

The structure of a display device according to a second example will be described with reference to FIG. 12.

Figure 12:
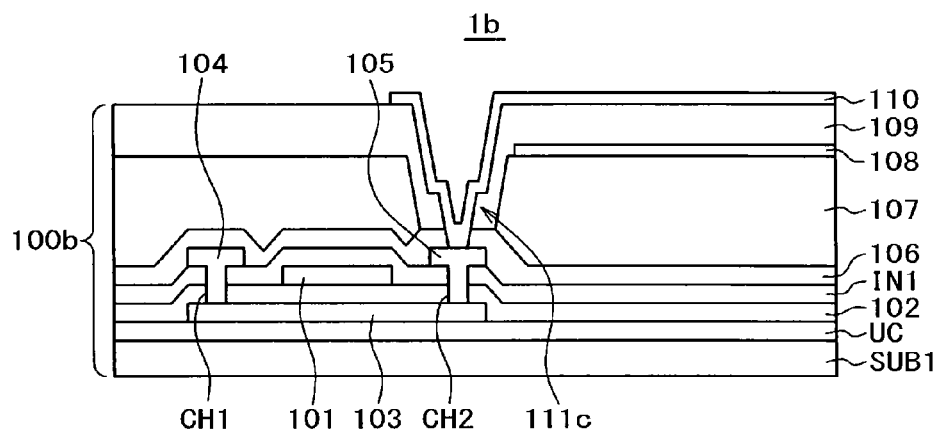
FIG. 12 is a cross sectional view of the structure of a pixel portion on a display region of the display device according to the second example.

FIG. 12 is a cross sectional view taken along line A-A' in FIG. 9. A display device 1b according to the second example is different from the display device 1a according to the first example in that an interlayer insulating film (a third interlayer film) 106 is formed between an organic insulating film 107 and a drain electrode 104 and a source electrode 105 of an array substrate 100b. The description will be made mainly on the difference.

On the drain electrode 104 and the source electrode 105, the interlayer insulating film 106 is formed. On the interlayer insulating film 106, the organic insulating film 107 is formed. On the organic insulating film 107, a contact hole (a first contact hole) is formed. On the organic insulating film 107, a common electrode 108 is formed. On the side wall of the organic insulating film 107 and on the common electrode 108 in the first contact hole, an interlayer insulating film 109 is formed, which includes a lower layer film (a first film) and an upper layer film (a second film). On the interlayer insulating film 109, a pixel electrode 110 is formed. The pixel electrode 110 is connected to the source electrode 105 of a thin film transistor through a contact hole (a second contact hole) 111c formed on the interlayer insulating film 106 and the interlayer insulating film 109.

For the interlayer insulating film 106, a silicon nitride film formed by plasma CVD is preferable. It is desirable that the interlayer insulating film 106 be formed into a dense film by being formed at high temperatures. Moreover, a silicon nitride film is adopted for both of the interlayer insulating film 106 and the interlayer insulating film 109, so that both films can be collectively dry etched to form the contact hole 111c. Thus, the processes can be simplified.

Next, an exemplary manufacturing method according to the example will be described.

After a TFT is formed by a general method, on the drain electrode 104 and the source electrode 105, a silicon nitride film is formed as the interlayer insulating film 106 by plasma CVD. The film forming conditions at this time are in which the film forming temperature (the substrate temperature) is 390° C. and the film thickness is 300 nm.

After that, by a manufacturing method similar to the first example, the organic insulating film 107, the counter electrode 108, and the interlayer insulating film 109 are formed.

Subsequently, a photoresist is formed on the interlayer insulating film 109. The photoresist is used as a mask to collectively etch the interlayer insulating film 106 and the interlayer insulating film 109, and the contact hole 111*c* is formed. For an etching gas, a mixed gas of sulfur hexafluoride ($SF_6$) and oxygen ($O_2$) is used for dry etching. Both films are collectively etched, so that the processes can be simplified. After that, the photoresist is removed by ashing. It may be fine that at this time, the photoresist is partially left. Dry etching is additionally performed, and the upper layer film of the interlayer insulating film 109 is removed. The remaining photoresist is removed in a wet manner. It may be fine that the upper layer film of the interlayer insulating film 109 is removed by any one of the methods according to the first modification to the third modification.

Subsequently, the pixel electrode is formed similarly to the first example.

It is noted that for the interlayer insulating film 106, the case is described where a silicon nitride film is formed. However, the interlayer insulating film 106 is not limited to this, and a silicon oxide film may be formed. It is noted that also in this case, it is desirable that a silicon nitride film be used for the interlayer insulating film IN1 or that the interlayer insulating film IN1 be formed in a stacked film including a silicon nitride film (a two-layer structure of a silicon oxide film and a silicon nitride film, for example).

THIRD EXAMPLE

The structure of a display device according to a third example will be described with reference to FIG. 13.

Figure 13:
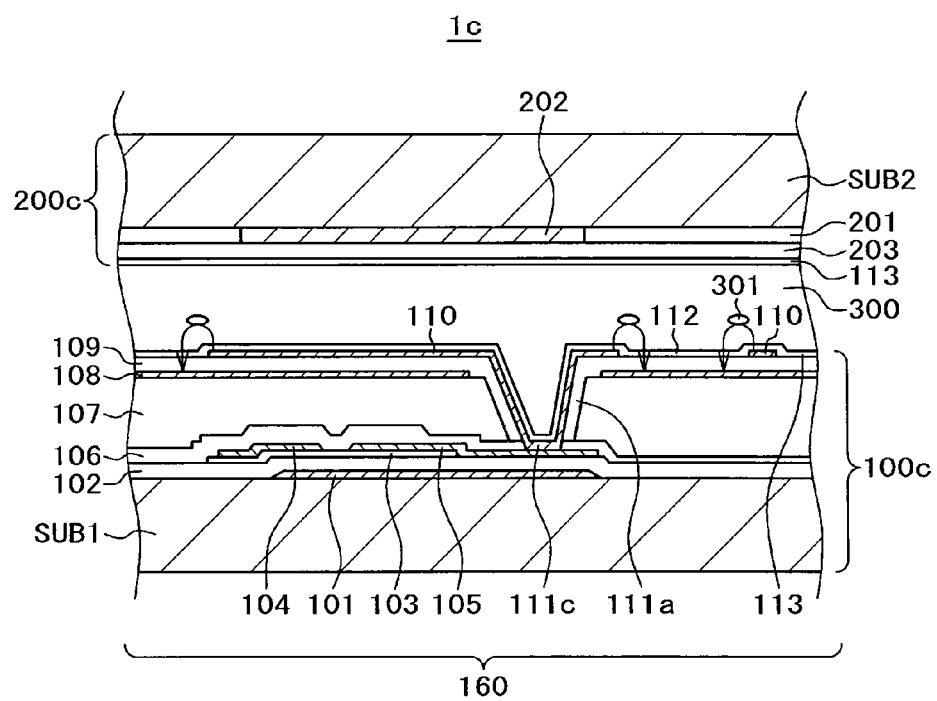
FIG. 13 is a cross sectional view of the structure of a pixel portion on a display region of the display device according to the third example.

FIG. 13 is a cross sectional view of the structure of a pixel portion on a display region of the display device according to the third example.

A display device 1*c* includes an array substrate 100*c*, a counter substrate 200*c*, and a liquid crystal layer 300 sandwiched between the array substrate 100*c* and the counter substrate 200*c*. The counter substrate 200*c* is attached to the array substrate 100*c* through a sealing material. A display region 160 of the array substrate 100*c* includes scanning signal lines, image signal lines, and pixels formed in a matrix configuration. The pixel includes a TFT and a pixel electrode. The counter substrate 200*c* includes a color filter and the like.

The array substrate 100*c* is formed greater than the counter substrate 200*c*. Similarly to the first example, a portion where only the array substrate 100*c* is provided is a terminal region in which an IC terminal that connects a driver IC and the like, a flexible circuit board that connects an external circuit the terminal, and the like are formed.

In short, the structure of the display device 1*c* is in which a pixel electrode 110 in a comb teeth shape is formed on a common electrode 108 formed throughout on the surface as an insulating film 109 is sandwiched. A voltage across the pixel electrode 110 and the common electrode 108 rotates liquid crystal molecules 301, the transmittance of the light of the liquid crystal layer 300 is controlled for the individual pixels, and an image is formed.

First, the array substrate 100*c* will be described.

As illustrated in FIG. 13, on a substrate SUB1 formed of glass, for example, a gate electrode 101 is formed. The gate electrode 101 is simultaneously formed with the scanning signal line. The gate electrode 101 includes an Al alloy layer and an Mo alloy, which is a cap layer and stacked on the Al alloy layer. For the Al alloy layer, an AlNd alloy, AlCu alloy, or the like is used, and for the Mo alloy, MoCr, MoW, or the like is used.

A gate insulating film 102 is formed of SiN (silicon nitride) as the gate electrode 101 is covered. The gate insulating film 102 is formed to the outer side of a sealing portion in order to protect the terminal portion. On the gate insulating film 102, a semiconductor layer 103 is formed of an a-Si (amorphous silicon) film at a position opposite to the gate electrode 101. The a-Si film forms the channel portion of the TFT, and a source electrode 104 and a drain electrode 105 are formed on the a-Si film as the channel portion is sandwiched.

The image signal line serves as the source electrode 104, and the drain electrode 105 is connected to the pixel electrode 110. Both of the source electrode 104 and the drain electrode 105 are simultaneously formed with each other in the same layer. In FIG. 13, although the source electrode 104 or the drain electrode 105 is illustrated in a single layer, the electrodes have a three-layer structure in which a cap layer is on the top and a base layer is on the bottom as an Al alloy layer is sandwiched. It is noted that the source electrode 104, the drain electrode 105, the image signal line, or the like sometimes has a two-layer structure including an Al alloy layer and a cap layer. Alternatively, the image signal line or the like sometimes has a single layer. In this case, an MoCr alloy or MoW alloy, for example, is used.

An interlayer insulating film (a third interlayer film) 106 is formed of SiN as the TFT is covered. The interlayer insulating film 106 protects the channel portion of the TFT against impurities more specifically.

On the interlayer insulating film 106, an organic insulating film (a first interlayer film) 107 is formed. Since the organic insulating film 107 also serves to protect the TFT as well as to planarize the surface, the film is formed thickly. The thickness ranges from 1 to 4 µm. The organic insulating film 107 is formed of a photosensitive resin, and can be patterned without using a resist. On the organic insulating film 107, a contact hole (a first contact hole) 111*a* that conducts electricity between the pixel electrode 110 and the drain electrode 105 is formed by patterning.

On the organic insulating film 107, the common electrode 108 is formed. The common electrode 108 is formed by sputtering ITO, which is a transparent conductive film, on the display region 160 entirely. After the common electrode 108 is formed throughout on the surface by sputtering, the common electrode 108 is removed by etching only from the contact hole 111*a* that conducts electricity between the pixel electrode 110 and the drain electrode 105.

The interlayer insulating film (the second interlayer film) 109 is formed of SiN as the common electrode 108 is covered. The interlayer insulating film 109 is formed in a two-layer structure by a manufacturing method similar to the first example. After the interlayer insulating film 109 is formed, a contact hole (a second contact hole) 111*c* is formed by etching. Similarly to the first example, the upper layer film of the interlayer insulating film 109 is removed. After that, ITO to be the pixel electrode 110 is formed by sputtering as the interlayer insulating film 109 and the contact hole 111*c* are covered. The sputtered ITO is patterned, and the pixel electrode 110 is formed. The ITO to be the pixel electrode 110 is also coated on the contact hole 111*c*. In the contact hole 111*c*, the drain electrode 105 and the pixel electrode 110 extending from the TFT are conducted to each other, and image signals are supplied to the pixel electrode 110.

An alignment film 113 that aligns the liquid crystal molecules 301 is formed on the pixel electrode 110. In FIG. 13, the counter substrate 200*c* is disposed as the liquid crystal layer 300 is sandwiched.

Next, the counter substrate 200c will be described. On the inner side of a substrate SUB2 formed of glass or the like, color filters 201 are formed for color display, and a black matrix 202 is formed between the color filter 201 and the color filter 201. The black matrix 202 is provided to improve a contrast, and also serves as a light shielding film for the TFT. An overcoat film 203 is formed as the color filter 201 and the black matrix 202 are covered. The overcoat film 203 is provided to relax the irregularities of the surface. On the overcoat film 203, an alignment film 113 is formed to determine the initial orientation of liquid crystals.

What is claimed is:

1. A manufacturing method of a display device comprising the steps of:
   (a) preparing a substrate having an electrode of a thin film transistor;
   (b) forming a first interlayer film on the electrode;
   (c) forming a first contact hole on the first interlayer film by removing a part of the first interlayer film;
   (j) forming a first electrode on the first interlayer film by forming a first conductive film and patterning the first conductive film;
   (d) forming a second interlayer film on the first interlayer film and in the first contact hole and on the first electrode, the second interlayer film having a first film and a second film provided above the first film, the second film having an etching rate faster than an etching rate of the first film;
   (e) forming a second contact hole on the second interlayer film in the first contact hole;
   (f) removing at least a part of the second film on the second contact hole and on the first electrode;
   (g) forming a second conductive film on the first layer of the second interlayer film and in the second contact hole; and
   (h) forming a second electrode by patterning the second conductive film on the second contact hole, wherein
   the step (a) includes preparing the substrate having the electrode of the thin film transistor in a pixel forming region and a wiring in a peripheral region outside of the pixel forming region,
   the step (b) includes forming the first interlayer film on the electrode in the pixel forming region and on the peripheral region,
   the step (c) includes removing at least a part of the first interlayer film in a first region of the pixel forming region and a part of the wiring forming region,
   the step (d) includes forming the second interlayer film in the first region, and
   the step (f) includes removing at least a part of the second film on the second interlayer film in the first region.

2. The manufacturing method of a display device according to claim 1,
   wherein the step (e) includes the steps of:
   (e1) patterning a photoresist, and
   (e2) dry etching the second interlayer film using the patterned photoresist as a mask.

3. The manufacturing method of a display device according to claim 2,
   wherein the step (f) includes the steps of:
   (f1) ashing the photoresist, and
   (f2) dry etching the second film.

4. The manufacturing method of a display device according to claim 3,
   wherein the step (f) includes the step of:
   (f3) removing the photoresist.

5. The manufacturing method of a display device according to claim 2,
   wherein the step (f) includes the steps of:
   (f1) ashing the photoresist, and
   (f2) wet etching the second film.

6. The manufacturing method of a display device according to claim 5,
   wherein the step (f) includes the step of:
   (f3) removing the photoresist.

7. The manufacturing method of a display device according to claim 2,
   wherein the step (f) includes the steps of:
   (f1) ashing the photoresist, and
   (f2) removing the photoresist.

8. The manufacturing method of a display device according to claim 7,
   wherein the step (f) includes the step of:
   (f3) dry etching the second film.

9. The manufacturing method of a display device according to claim 1, wherein the first interlayer film is an organic film.

10. The manufacturing method of a display device according to claim 9, wherein the organic film is formed of a photosensitive resin.

11. The manufacturing method of a display device according to claim 1, wherein the second interlayer film is a silicon nitride film (SiN).

12. The manufacturing method of a display device according to claim 11, wherein the silicon nitride film is formed by plasma CVD.

13. The manufacturing method of a display device according to claim 12, wherein film forming conditions for the first film and the second film of the silicon nitride film are changed.

14. The manufacturing method of a display device according to claim 13, wherein in the step of forming the first film and the second film of the silicon nitride film, a gas flow ratio of monosilane ($SiH_4$) to ammonia ($NH_3$), which are material gases, is changed in forming the films by plasma CVD.

15. The manufacturing method of a display device according to claim 1, wherein the second electrode is a pixel electrode.

16. The manufacturing method of a display device according to claim 15, further comprising the step of:
    (i) forming an alignment film on the pixel electrode.

17. The manufacturing method of a display device according to claim 1, wherein the electrode of thin film transistor is a drain electrode.

18. The manufacturing method of a display device according to claim 1, wherein a semiconductor layer of the thin film transistor is formed of polysilicon.

19. The manufacturing method of a display device according to claim 1, further comprising the step of:
    (k) depositing a sealing material on the first film of the second interlayer film in the first region.

* * * * *